United States Patent
Arimoto

(10) Patent No.: US 6,181,005 B1
(45) Date of Patent: *Jan. 30, 2001

(54) SEMICONDUCTOR DEVICE WIRING STRUCTURE

(75) Inventor: Kazutami Arimoto, Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

This patent is subject to a terminal disclaimer.

(21) Appl. No.: 09/240,691

(22) Filed: Feb. 2, 1999

Related U.S. Application Data

(63) Continuation of application No. 08/780,916, filed on Jan. 9, 1997, now Pat. No. 5,883,427.

(30) Foreign Application Priority Data

Sep. 10, 1996 (JP) .................................................. 8-239067

(51) Int. Cl.⁷ .......................... H01L 23/495; H01L 23/50; H01L 27/04
(52) U.S. Cl. .......................... 257/691; 257/690; 257/616; 257/784; 257/211; 257/208; 257/207; 257/786
(58) Field of Search .................................... 257/690, 666, 257/786, 784, 211, 207, 208, 210, 776, 687, 691, 781–783, 676

(56) References Cited

U.S. PATENT DOCUMENTS

| | | | |
|---|---|---|---|
| 4,654,689 | 3/1987 | Fujii . | |
| 4,706,105 | 11/1987 | Masuda et al. . | |
| 4,862,245 | 8/1989 | Pashby et al. . | |
| 4,870,300 | 9/1989 | Nakaya et al. | 307/303 |
| 5,065,216 | 11/1991 | Suzuki et al. . | |
| 5,161,124 | * 11/1992 | Love | 361/222 |
| 5,229,846 | 7/1993 | Kozuka | 257/678 |
| 5,235,207 | 8/1993 | Ohi et al. | 257/670 |
| 5,276,352 | 1/1994 | Komenaka et al. | 257/666 |
| 5,300,798 | 4/1994 | Yamazaki et al. | 257/207 |
| 5,311,057 | * 5/1994 | McShane | 257/676 |
| 5,378,925 | 1/1995 | Sasaki | 257/691 |
| 5,393,996 | 2/1995 | Lang | 257/210 |
| 5,394,032 | 2/1995 | Conzelmann et al. | 326/38 |
| 5,446,410 | 8/1995 | Nakakura | 257/211 |
| 5,455,460 | * 10/1995 | Hongo et al. | 257/734 |
| 5,715,147 | * 2/1998 | Nagano | 257/676 |
| 5,801,451 | * 9/1998 | Yamauchi | 257/786 |
| 5,838,072 | * 11/1998 | Li et al. | 257/786 |
| 5,903,057 | * 5/1999 | Allen | 257/776 |
| 5,949,139 | * 9/1999 | Imura et al. | 257/723 |
| 5,982,043 | * 11/1999 | Iwata | 257/786 |
| 5,986,345 | * 11/1999 | Monnot | 257/773 |
| 6,048,753 | * 4/2000 | Farnworth et al. | 438/111 |

FOREIGN PATENT DOCUMENTS

| | | |
|---|---|---|
| 195 40 647 A1 | 10/1996 | (DE) . |
| 0 642 162 A2 | 3/1995 | (EP) . |
| 59-46044 | 3/1984 | (JP) . |
| 59-143357 | 8/1984 | (JP) . |
| 60-22327 | 2/1985 | (JP) . |
| 61-284953 | 12/1986 | (JP) . |
| 62-106657 | 5/1987 | (JP) . |
| 63-52458 | 3/1988 | (JP) . |
| 1-137647 | 5/1989 | (JP) . |
| 1-154533 | 6/1989 | (JP) . |
| 2-251169 | 10/1990 | (JP) . |
| 3-212955 | 9/1991 | (JP) . |
| 4-167534 | 6/1992 | (JP) . |
| 4-199673 | 7/1992 | (JP) . |
| 5-128855 | 5/1993 | (JP) . |
| 5-129464 | 5/1993 | (JP) . |
| 6-120424 | 4/1994 | (JP) . |

* cited by examiner

*Primary Examiner*—Alexander O. Williams
(74) *Attorney, Agent, or Firm*—McDermott, Will & Emery

(57) ABSTRACT

The semiconductor device has a plurality of bonding pads arranged along opposing longitudinal sides of a semiconductor integrated circuit, and the bonding pads are connected to a power supply interconnection layer and a ground interconnection layer which are provided on the main surface of the semiconductor integrated circuit with a film coat interposed. By this structure, it becomes possible to shorten the extension of power supply lines by wirings, and hence power source can be reinforced.

14 Claims, 10 Drawing Sheets

62PIN TSOP2
16mm width
25.75mm length
0.8mm lead pitch

| Pin | Signal | | Pin | Signal |
|---|---|---|---|---|
| 1 | Vdd | | 62 | Vss |
| 2 | DQ0 | | 61 | DQ7 |
| 3 | VddQ/Vdd | | 60 | VssQ/Vss |
| 4 | DQ1 | | 59 | DQ6 |
| 5 | DQ2 | | 58 | DQ5 |
| 6 | VssQ/Vss | | 57 | VddQ/Vdd |
| 7 | DQ3 | | 56 | DQ4 |
| 8 | NC | | 55 | NC |
| 9 | Vdd | | 54 | Vss |
| 10 | NC | | 53 | NC |
| 11 | NC | | 52 | VREF/NC |
| 12 | NC | | 51 | /LCE |
| 13 | /W | | 50 | /UCE |
| 14 | /RAS | | 49 | /G |
| 15 | Vdd | | 48 | Vss |
| 16 | A0 | | 47 | A13 |
| 17 | A1 | | 46 | A12 |
| 18 | A2 | | 45 | A11 |
| 19 | A3 | | 44 | A10 |
| 20 | A4 | | 43 | A9 |
| 21 | A5 | | 42 | A8 |
| 22 | A6 | | 41 | A7 |
| 23 | Vdd | | 40 | Vss |
| 24 | NC | | 39 | NC |
| 25 | DQ8 | | 38 | DQ15 |
| 26 | VssQ/Vss | | 37 | Vdd/VddQ |
| 27 | DQ9 | | 36 | DQ14 |
| 28 | DQ10 | | 35 | DQ13 |
| 29 | VddQ/Vdd | | 34 | Vss/VssQ |
| 30 | DQ11 | | 33 | DQ12 |
| 31 | Vdd | | 32 | Vss |

Row    A0–A13
Column A0–A9

SEMICONDUCTOR DEVICE WIRING STRUCTURE

This application is a continuation of application Ser. No. 08/780,916 filed Jan. 9, 1997 now U.S. Pat. No. 5,883,427.

BACKGROUND OF THE INVENTION

1. Field of the Invention

The present invention relates to a semiconductor device, and, more specifically, to an improvement of a semiconductor package structure having reinforced power source.

2. Description of the Background Art

Recently, higher speed of operation has been required of semiconductor devices such as a DRAM (Dynamic Random Access Memory). As the speed of operation of the semiconductor device increases, generation of noise has come to be a serious problem. In order to prevent generation of noise, generally, power supply is reinforced by increasing number of bonding pads for the power supply provided in the semiconductor device.

FIG. 11 shows pin arrangement of a 256 megabit DRAM 100 standardized by JEDEC (Joint Electron Device Council). There are five power sources for supplying power supply potential (VDD) on the left column, and five power sources for supplying ground potential (VSS) on the right column.

At present, TSOP (Thin Small Outline Package) is dominant as the semiconductor package used for DRAMs and the like. The structure of the TSOP will be briefly described with reference to FIGS. 12 and 13. FIG. 12 is a plan view showing the structure of the TSOP. For convenience, sealing resin is not shown. FIG. 13 is a cross section taken along the line 13—13' of FIG. 12.

As shown in these figures, the structure of the TSOP includes a silicon substrate 101, and a semiconductor integrated circuit 105 formed on a main surface of silicon substrate 101 and covered by a passivation film 106. Further, there is a plurality of bonding pads 102 formed for connection with the semiconductor integrated circuit 105.

Bonding pads 102 are arranged along longitudinal sides of semiconductor integrated circuit 105. A lead frame 103 for providing connection with external terminals by means of wirings 104 are connected to bonding pads 102. Silicon substrate 101, semiconductor integrated circuit 105, passivation film 106, bonding pads 102, wirings 104 and part of the lead frame 103 are sealed by a resin 107.

A structure of a LOC type TSOP, which is an improvement of the TSOP above will be described with reference to FIGS. 14 and 15. FIG. 14 is a plan view showing the structure of the LOC type TSOP. For convenience, sealing resin is not shown. FIG. 15 is a cross section taken along the line 15—15' of FIG. 14.

As shown in these figures, the structure of the LOC type TSOP includes a semiconductor integrated circuit 115 formed on a silicon substrate 111, and bonding pads 112 arranged in one line at the center of silicon substrate 111 for connection with the semiconductor integrated circuit 115. Semiconductor integrated circuit 115 is covered by a passivation film 116. A lead frame 113 is arranged to extend above semiconductor integrated circuit 115 with a film coat 117 on passivation film 116 interposed.

Lead frame 113 is connected to bonding pads 112 by means of wirings 114. Silicon substrate 111, semiconductor integrated circuit 115, passivation film 116, film coat 117, bonding pads 112, wirings 114 and part of the lead frame 113 are sealed by resin 118.

When we compare the structure of the conventional type TSOP shown in FIG. 13 and the LOC type TSOP shown in FIG. 15, in the LOC type TSOP, a distance $x_2$ between a side surface of sealing resin 118 and a side surface of silicon substrate 111 can be made shorter than a distance $x_1$ in the conventional TSOP, as the lead frame 113 extends above semiconductor integrated circuit 115. Since the outer dimension of the sealing resin has been standardized, a semiconductor circuit having higher degree of integration can be used, and area of the semiconductor integrated circuit can be enlarged within the same shape.

A structure of a path bar type TSOP which is an improvement of LOC type TSOP will be described with reference to FIGS. 16 and 17. FIG. 16 is a plan view showing the structure of the path bar type TSOP. For convenience, sealing resin is not shown. FIG. 17 is a cross section taken along the line 17—17 of FIG. 16.

As shown in these figures, the structure of the path bar type TSOP is, basically, similar to the structure of the conventional LOC type TSOP. A semiconductor integrated circuit 128 is formed on a silicon substrate 121, and bonding pads 122 for connection with the semiconductor integrated circuit 128 are arranged in one line at the center of silicon substrate 121.

Semiconductor integrated circuit 128 is covered by a passivation film 127. Lead frame 123 is arranged extending above semiconductor integrated circuit 128 with film coat 126 on passivation film 127 interposed. Further, lead frame 123 is connected to bonding pads 122 by wirings 129. Silicon substrate 121, semiconductor integrated circuit 128, passivation film 127, film coat 126, bonding pads 122, wirings 129 and part of the lead frame 123 are sealed by resin.

In the path bar type TSOP structure, in order to reinforce power sources to prevent generation of noise, number of bonding pads for power sources provided in the semiconductor device has been increased. As shown in the plan view of FIG. 16, an auxiliary lead frame 125 is arranged along bonding pads 122, which is connected to lead frame 123 for the power supply line. By providing auxiliary lead frame 125 connected to the power supply line, it becomes possible to provide power source pads at arbitrary positions, so that power source of the semiconductor device can be reinforced.

Meanwhile, a BGA (Ball Grid Array) has been studied as a new package for a semiconductor device such as a DRAM. The structure of the BGA will be briefly described with reference to FIGS. 18 and 19. FIG. 18 is a perspective view showing schematic structure of the BGA, and FIG. 19 is a perspective view of the rear surface of the BGA.

Referring to these figures, on a substrate 141 provided with interconnections printed thereon, a chip 143 having a semiconductor integrated circuit formed therein is mounted, and chip 143 is connected to printed interconnections of substrate 141 by means of wirings 144. Printed interconnections, wirings 144 and chip 143 are sealed by an epoxy resin 142.

On the rear surface, a plurality of bump electrodes 145 formed of spherical solder, for example, are arranged in an array, and these function similar to the lead frame of the conventional TSOP structure described above. Substrate 141 has multilayered interconnection structure, and prescribed bump electrodes 145 are connected to the printed circuit board.

In the path bar structure shown in FIGS. 16 and 17, it is necessary to arrange bonding pads 122 at the central portion of silicon substrate 121. However, when the number of bonding pads 121 is increased to reinforce the power source, there is a limit in the increase of the number of bonding pads 121 arranged in one line, as the size of the semiconductor device is standardized. It may be possible to arrange bonding pads 122 in two lines at the center of silicon substrate 121. However, in that case, there would be long and complicated extensions of power supply lines provided by wirings. As a result, there would be voltage drop over the power supply lines, which makes it difficult to reinforce the power source.

SUMMARY OF THE INVENTION

An object of the present invention is to provide a semiconductor device which can reinforce power source by shortening the distance of power supply line extension provided by wirings.

According to one aspect of the present invention, the semiconductor device includes a semiconductor integrated circuit provided on a main surface of a semiconductor substrate, a plurality of bonding pads provided for connection with the semiconductor integrated circuit, arranged on opposing longitudinal sides of the semiconductor integrated circuit on the main surface of the semiconductor substrate, an interconnection layer connected by means of wirings to prescribed bonding pads, provided on the semiconductor integrated circuit with an insulating member interposed, and a plurality of lead frames connected to prescribed bonding pads and to the interconnection layer by means of wirings.

In this manner, bonding pads are arranged along opposing sides of the semiconductor integrated circuit and an interconnection layer is provided on the semiconductor integrated circuit with an insulating member interposed. Therefore, when a power supply interconnection layer and a ground interconnection layer are provided as interconnection layers and bonding pads for the power sources are arranged on the side opposite to the power supply terminals, it is possible to connect the power supply interconnection layer and the bonding pads by shortest possible wirings from the power supply interconnection layer, by positioning the power supply interconnection layer near the bonding pads.

Similarly, even when bonding pads for grounding are arranged on the side opposite to the external ground terminals, the ground interconnection layer and the bonding pads can be connected by shortest possible wirings from the ground interconnection layer, by positioning the ground interconnection layer near the bonding pads.

Therefore, unlike the prior art examples, complicated and long extension of wirings can be avoided, voltage drop of the power supply caused by the long extension of the wirings can be prevented, and the power source can be reinforced.

In another aspect of the present invention, the semiconductor device includes a semiconductor integrated circuit provided on the main surface of the semiconductor substrate, a plurality of bonding pads provided for connection with the semiconductor integrated circuit, arranged along opposing longitudinal sides of the semiconductor integrated circuit on the main surface of the semiconductor substrate, a first conductive layer provided on a rear surface of the semiconductor substrate with a first insulating film interposed, a plurality of contact electrodes provided on the main surface of the first insulating film and connected to prescribed bonding pads by means of wirings, a second conductive layer provided on the first conductive layer with a second insulating layer interposed, and a plurality of bump electrodes for connection with external terminals, provided on the second conductive layer with a third insulating film interposed. Further, it includes a first interconnection for connecting the first conductive layer with a prescribed bump electrode, piercing through the second insulating film, the second conductive layer and the third insulating film, a second interconnection for connecting the second conductive layer with a prescribed bump electrode through the third insulating film, a third interconnection for connecting the first conductive layer with a prescribed contact electrode through the first insulating film, a fourth interconnection connecting the second conductive layer with a prescribed contact electrode through first insulating film, first conductive layer and the second insulating film, and a fifth interconnection for connecting a prescribed contact electrode with a prescribed bump electrode through the first insulating film, the first conductive layer, the second insulating film, the second conductive layer and the third insulating film.

In this manner, a plurality of contact electrodes connected to the bonding pads by means of wirings are arranged on the side of the semiconductor integrated circuit, a plurality of bump electrodes for connection with external terminals are provided on the rear surface, and first and second conductive layers are formed between the contact electrodes and the bump electrodes with a plurality of insulating films interposed. Therefore, by connecting the contact electrodes, bump electrodes and the first and second conductive layers by appropriately using the first, second, third, fourth and fifth interconnections, it becomes possible to provide the power supply potential or the ground potential by shortest possible wiring to an arbitrary bonding pad, when the first conductive layer is used as the power supply potential layer and the second conductive layer is used as the ground potential layer, for example. Therefore, voltage drop caused by long extension of the wirings experienced in the prior art can be prevented, and the power source can be reinforced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 shows pin arrangement of a 256 megabit DRAM for TSOP package, standardized by JEDEC.

DESCRIPTION OF THE PREFERRED EMBODIMENTS

First to third embodiments of the semiconductor package in accordance with the present invention will be described with reference to the figures.

First Embodiment

Figure 1:
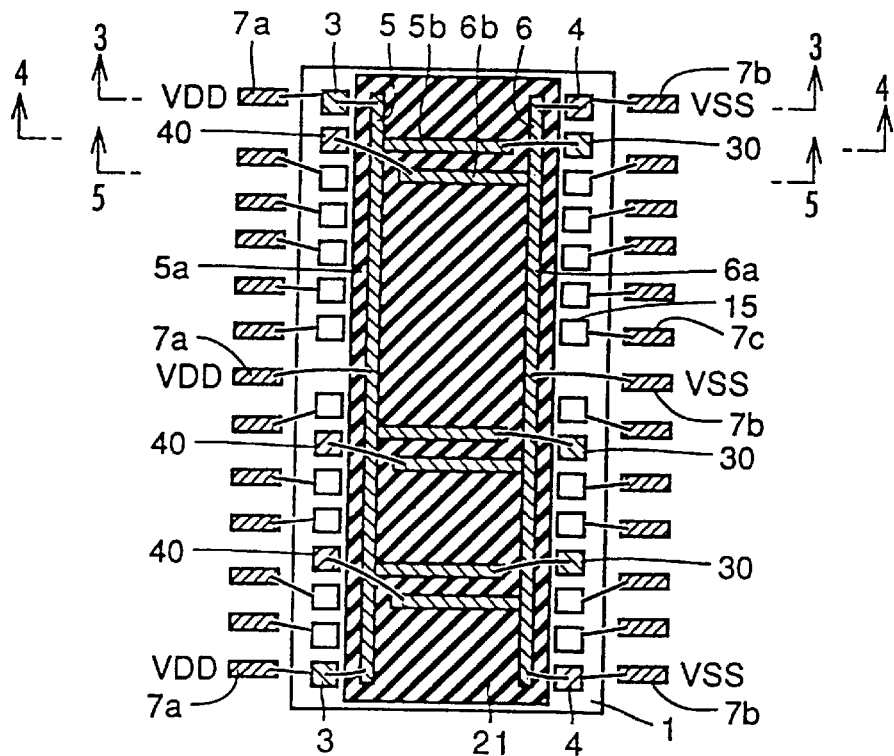
FIG. 1 is a plan view showing a structure of a semiconductor device in accordance with a first embodiment of the present invention.
Figure 2:
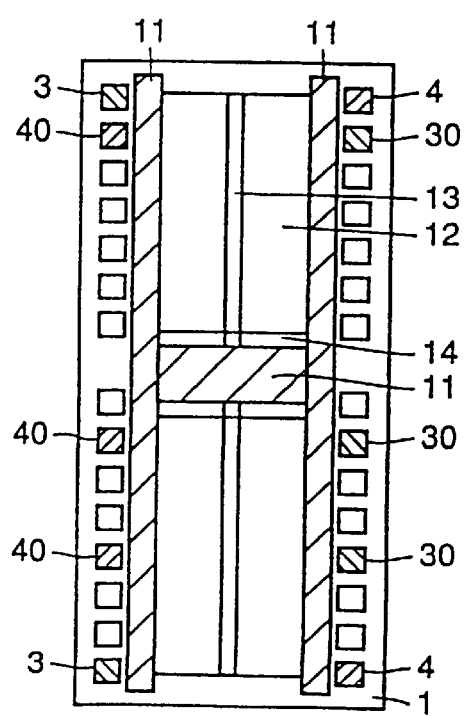
FIG. 2 is a plan view showing a circuit structure of a semiconductor integrated circuit.
Figure 3:
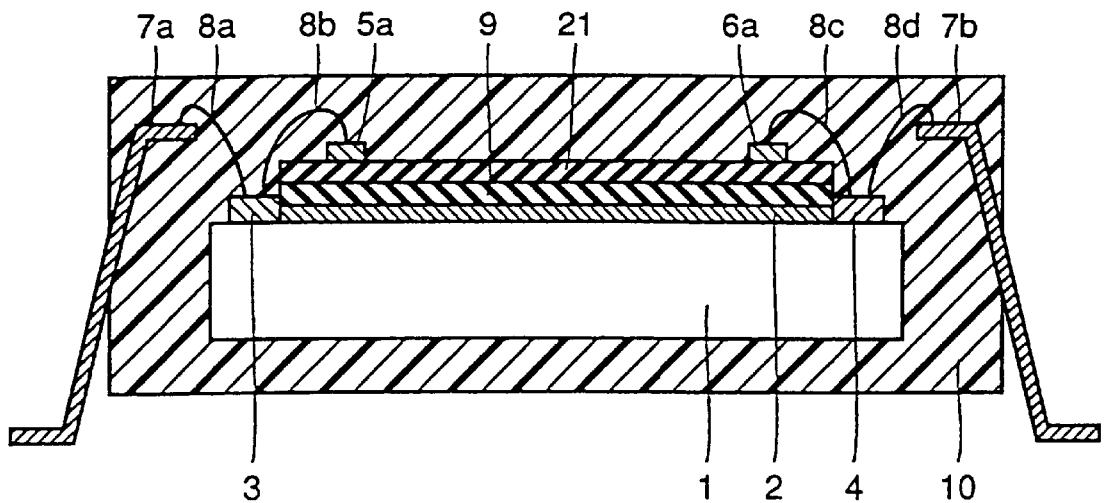
FIG. 3 is a cross section taken along the line 3—3'of FIG. 1.
Figure 4:
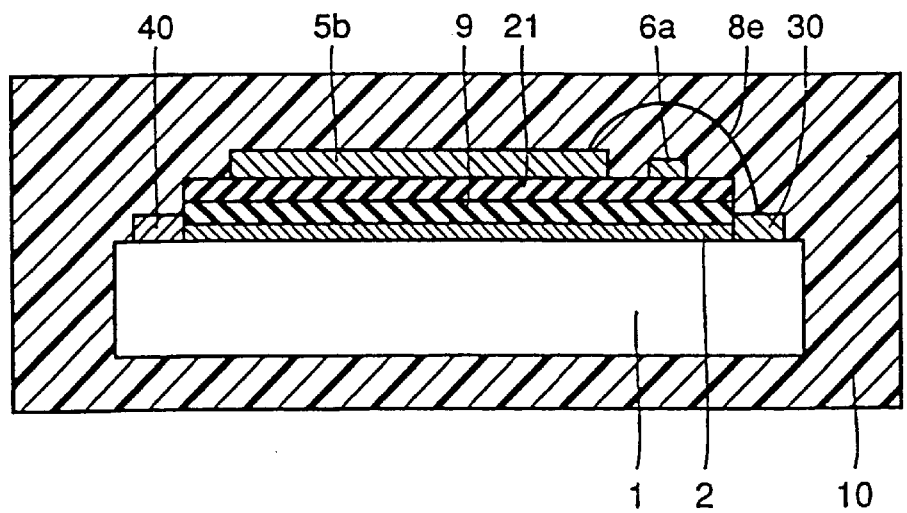
FIG. 4 is a cross section taken along the line 4—4' of FIG. 1.
Figure 5:
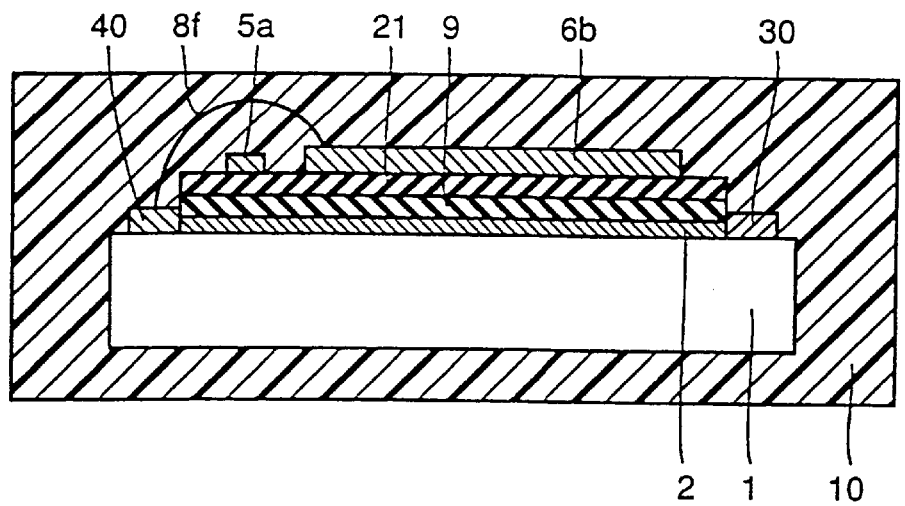
FIG. 5 is a cross section taken along the line 5—5' of FIG. 1.

Referring to FIGS. 1 to 5, the semiconductor device in accordance with the first embodiment will be described. FIG. 1 is a plan view of the semiconductor device of the present embodiment. For convenience, sealing resin is not shown. FIG. 2 shows arrangement of circuits in the semiconductor integrated circuit, FIG. 3 is a cross section taken along the line 3—3' of FIG. 1, FIG. 4 is a cross section taken along the line 4—4' of FIG. 1, and FIG. 5 is a cross section taken along the line 5—5' of FIG. 1.

Referring to FIGS. 1 and 3 to 5, the semiconductor device of the present embodiment includes a semiconductor integrated circuit 2 on a silicon substrate 1, and the semiconductor integrated circuit 2 is covered by a passivation film 9.

On passivation film 9, a power supply interconnection layer 5 patterned to prescribed shapes are formed, with an insulating film coat 21 interposed.

Power supply interconnection layer 5 includes a first power supply interconnection layer 5a extending in the longitudinal direction and a plurality of second power supply interconnection layer 5b branching in vertical direction from the first power supply interconnection layer 5a. Ground interconnection layer 6 has, similar to power supply interconnection layer 5, a first ground interconnection layer 6a extending in the longitudinal direction and a plurality of second ground interconnection layers 6b branching in vertical direction from the first ground interconnection layer 6a.

On opposing sides in the longitudinal direction of the semiconductor integrated circuit 2, bonding pads are provided, which are connected to semiconductor integrated circuit 2. The bonding pads include, as shown in FIGS. 2 and 3, bonding pads 3 for power supply potential, connected to a power supply potential lead frame 7a for providing the power supply potential (VDD) by means of a wiring 8a, and bonding pads 4 for the ground potential connected to a ground potential lead frame 7b for applying the ground potential (VSS) by means of a wiring 8d.

The bonding pad 3 for the power supply potential is connected to the first power supply interconnection layer 5a of power supply interconnection layer 5 by means of a wiring 8b, and bonding pad 4 for the ground potential is connected to the first ground interconnection layer 6a of the ground interconnection layer 6 by means of wiring 8d.

Further, as shown in FIGS. 1 and 4, there are a bonding pad 30 for the power supply not connected to the lead frame but connected only to the second power supply interconnection layer 5b of power supply interconnection layer 5 by means of a wiring 8e, and, as shown in FIGS. 1 and 5, a bonding pad 40 for the ground potential connected only to the second ground interconnection layer 6b of ground interconnection layer 6 by means of a wiring 8f.

Further, there are a plurality of CLK bonding pads 15 connected to a lead pin 7c for a signal by means of a wiring, for exchanging signals with the outside. In the semiconductor integrated circuit 2, referring to FIG. 2, there are peripheral circuit regions 11 on opposing sides, a memory cell region 12, row decoders 13 and column decoders 15 arranged at the central portion.

Silicon substrate 1, semiconductor integrated circuit 2, passivation film 9, film coat 21, power supply interconnection layer 5, ground interconnection layer 6, wirings 8a, 8b, 8c, 8d, 8e, 8f and part of lead frames 7a, 7b, and 7c are sealed by sealing resin 10.

In the semiconductor device in accordance with the present embodiment described above, bonding pads 3 and 30 for the power supply, bonding pads 4 and 40 for the ground potential and bonding pads 15 for CLK are arranged along opposing sides of semiconductor integrated circuit 2, and power supply interconnection layer 5 and ground interconnection layer 6 are formed on the main surface of semiconductor integrated circuit 2 with film coat 21 interposed. Therefore, even when bonding pad 30 for the power supply is arranged opposing to the lead frame 7a for the power supply terminal, it is possible to connect the power supply interconnection layer 5 to the bonding pad 30 for the power supply potential by shortest wiring from the power supply interconnection layer 5, by positioning the power supply interconnection layer 5 near the bonding pad 30 for the power supply potential.

Similarly, even when bonding pad 40 for the ground potential is arranged opposing to the lead frame 7b for the ground terminal, it is possible to connect the ground interconnection layer 6 and the bonding pad 40 for the ground potential by shortest wiring from the ground interconnection layer 6, by positioning the ground interconnection layer 6 near the bonding pad 40 for the ground potential.

Therefore, extension of the wirings for the power supply line in the semiconductor device can be shortened, and voltage drop over the power supply line can be reduced. Further, it becomes possible to provide pads only for supplying the power to semiconductor integrated circuit 2, which are not connected to the lead frame, such as bonding pad 30 for the power supply potential and the bonding pad 40 for the ground potential. Therefore, in each peripheral circuit 11, power supply can be sufficiently reinforced, allowing higher speed of operation.

Second Embodiment

Figure 6:
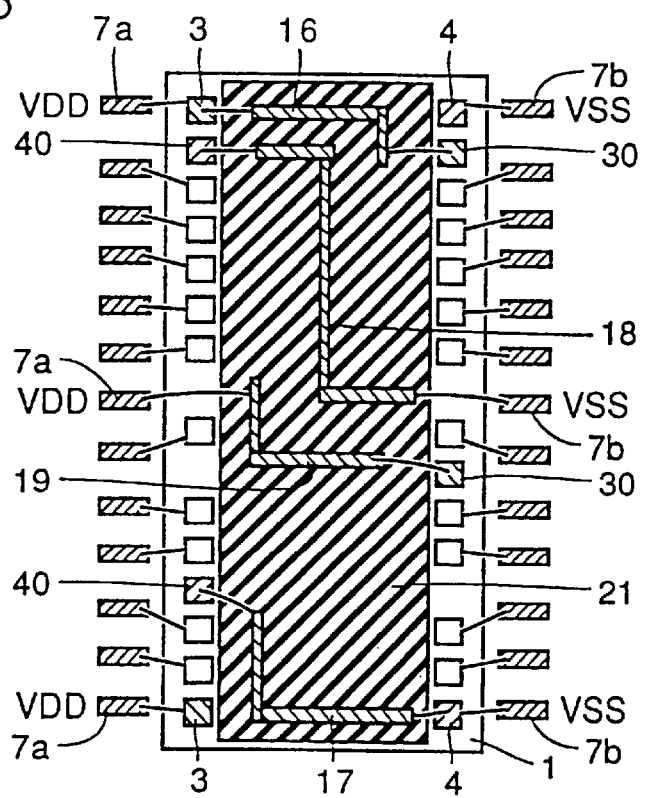
FIG. 6 is a plan view showing a structure of a semiconductor device in accordance with a second embodiment of the present invention.

A semiconductor package in accordance with the second embodiment will be described with reference to FIG. 6. FIG. 6 shows a planar structure of the semiconductor device in accordance with the present embodiment. For convenience, sealing resin is not shown.

In the semiconductor device in accordance with the first embodiment above, wiring 8e connected to bonding pad 30 for the power supply potential is arranged across the first ground interconnection layer 6a of ground interconnection layer 6, as shown in FIG. 1. However, such arrangement, that is, arrangement of the wiring across other interconnection layer, may cause defect such as undesirable contact between the wiring and the interconnection layer.

Therefore, in the semiconductor device of the present embodiment, power supply interconnection layers 16 and 17 as well as ground interconnection layers 18 and 19 are patterned as shown in the plan view of FIG. 6, so that the wirings are arranged not crossing other interconnection layers.

In the semiconductor device having such an interconnection structure also, similar effects as the first embodiment can be obtained, and in addition, malfunction caused by the contact between the wiring and the interconnection layer can be prevented.

Third Embodiment

Figure 7:
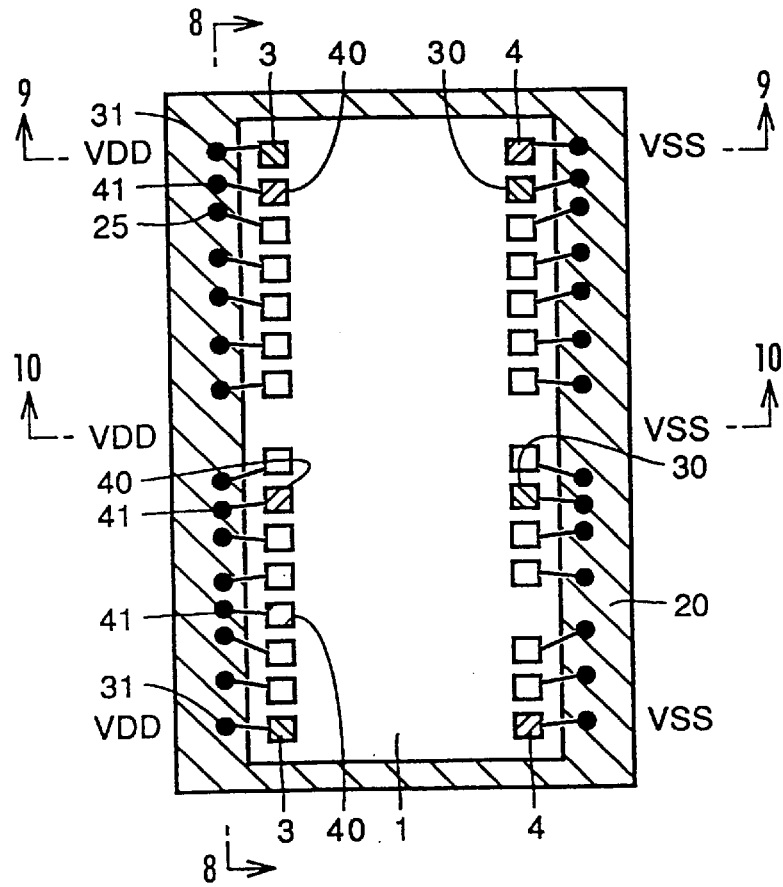
FIG. 7 is a plan view showing a structure of a semiconductor device in accordance with a third embodiment of the present invention.
Figure 8:
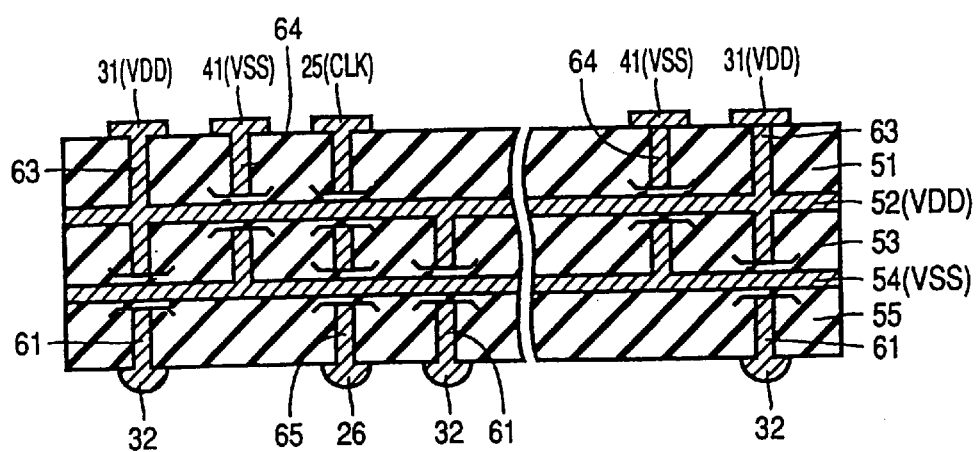
FIG. 8 is a cross section taken along the line 8—8' of FIG. 7.

The semiconductor device in accordance with the third embodiment will be described with reference to FIGS. 7 to 10. FIG. 7 is a plan view of the semiconductor device in accordance with this embodiment. For convenience, passivation film is not shown. FIG. 8 is a cross section taken along the line 8—8' of FIG. 7, FIG. 9 is a cross section taken along the line 9—9', and FIG. 10 is a cross section taken along the line 10—10'.

Figure 9:
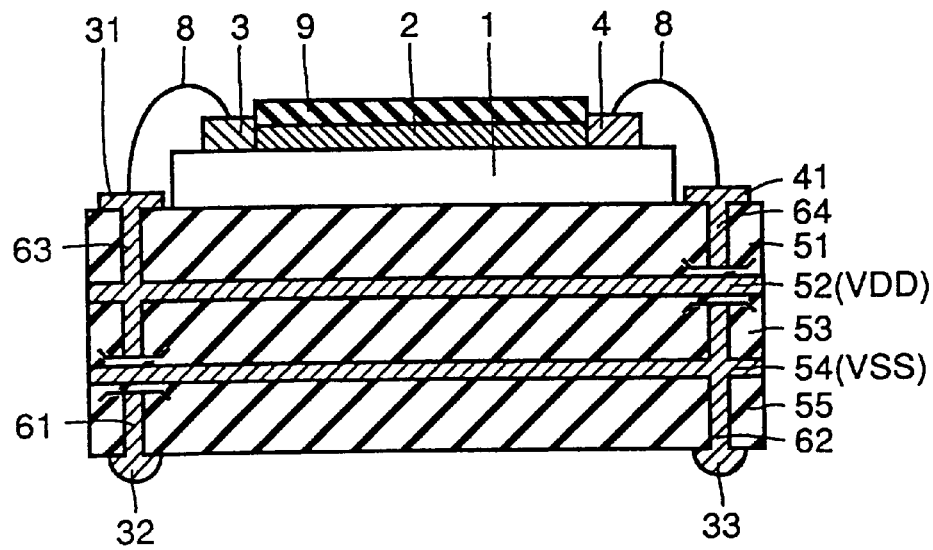
FIG. 9 is a cross section taken along the line 9—9' of FIG. 7.
Figure 10:
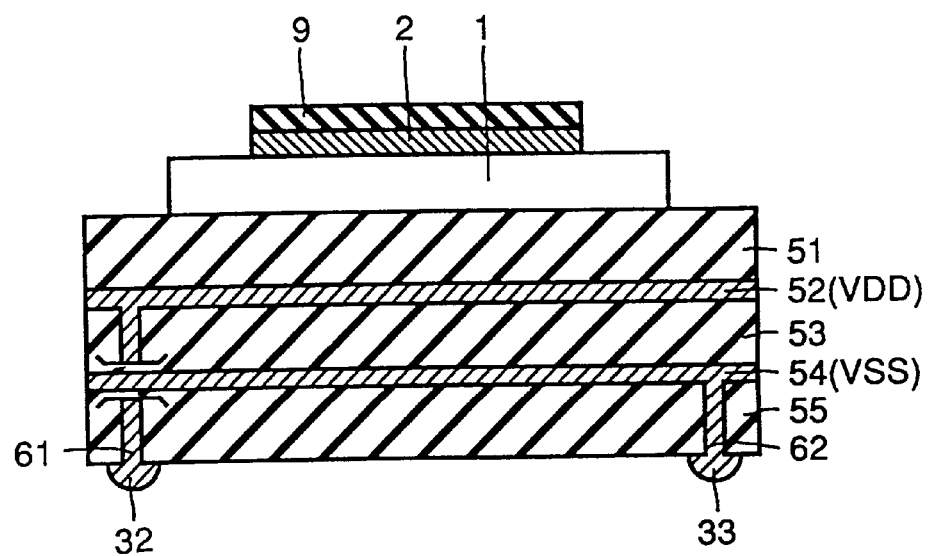
FIG. 10 is a cross section taken along the line 10—10' of FIG. 7.
Figure 12:
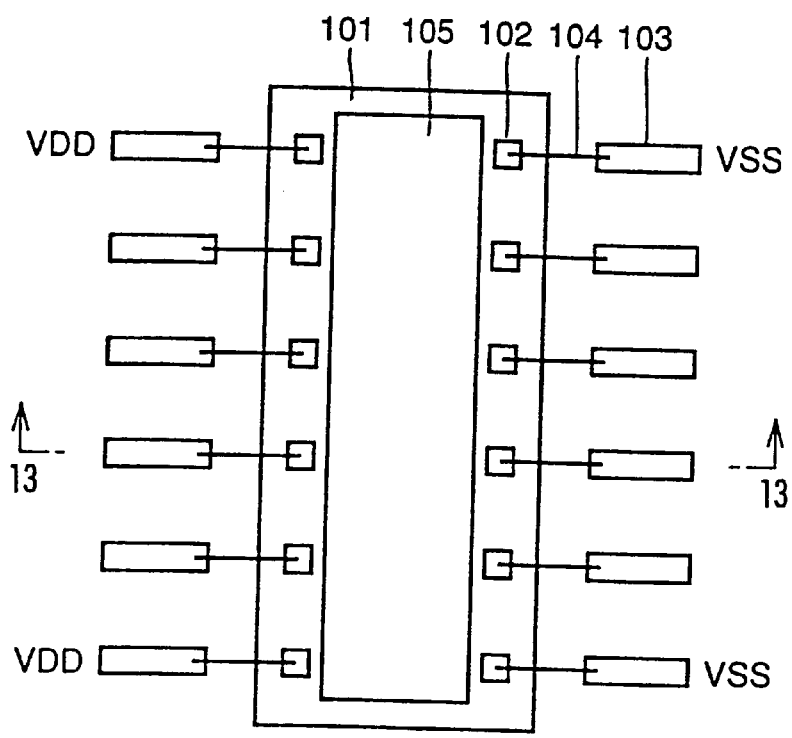
FIG. 12 is a plan view showing a TSOP structure of a semiconductor device in accordance with the prior art.
Figure 13:
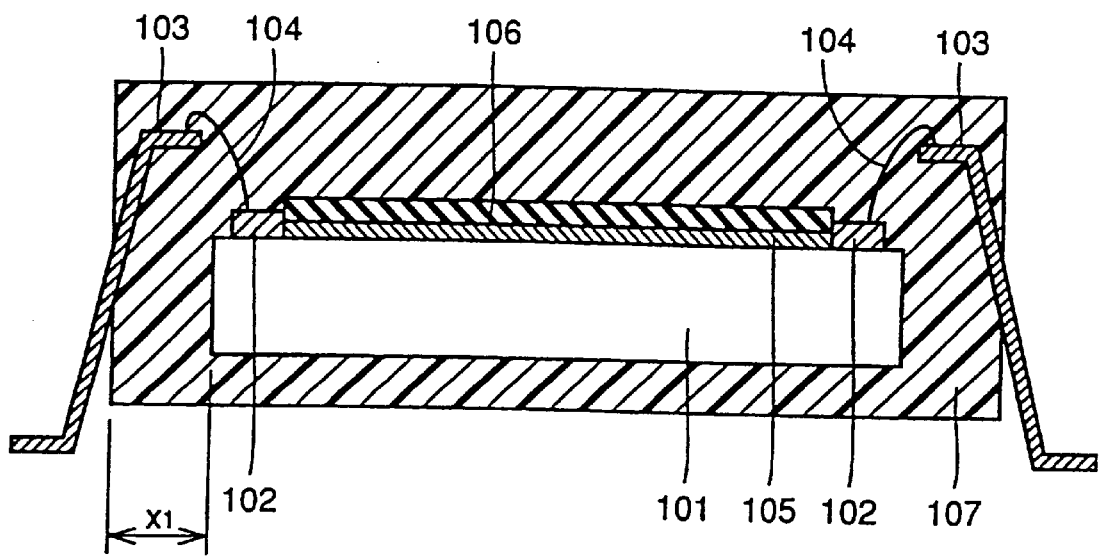
FIG. 13 is a cross section taken along the line 13—13' of FIG. 12.
Figure 14:
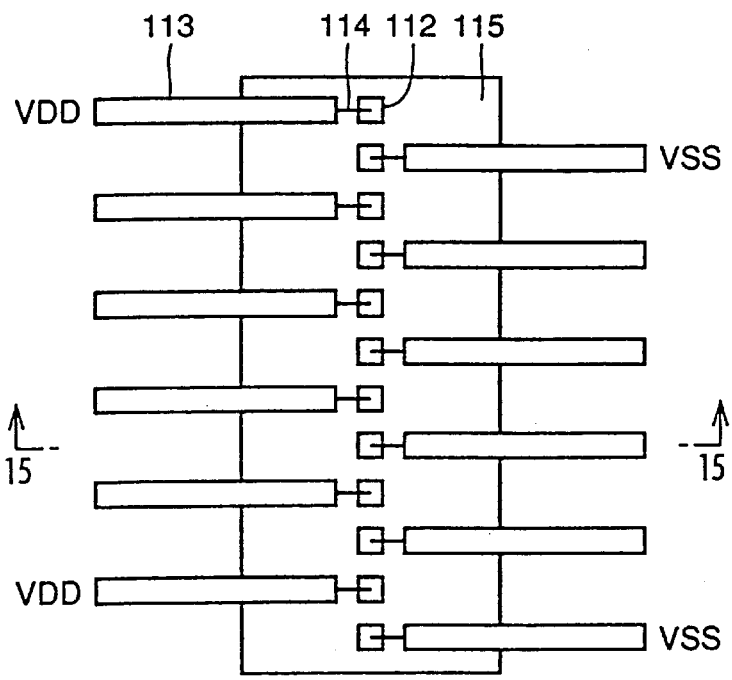
FIG. 14 is a plan view showing an LOC type TSOP structure of a semiconductor device of the prior art.
Figure 15:
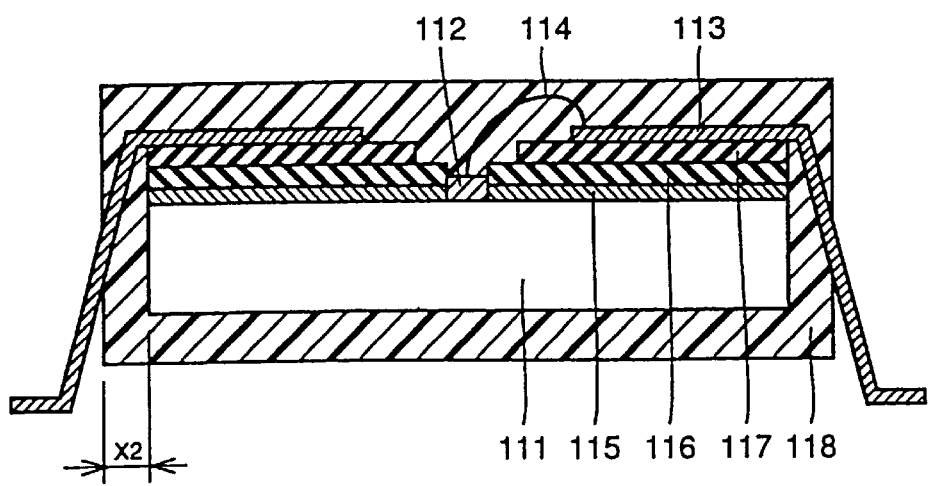
FIG. 15 is a cross section taken along the line 15—15' of FIG. 14.
Figure 16:
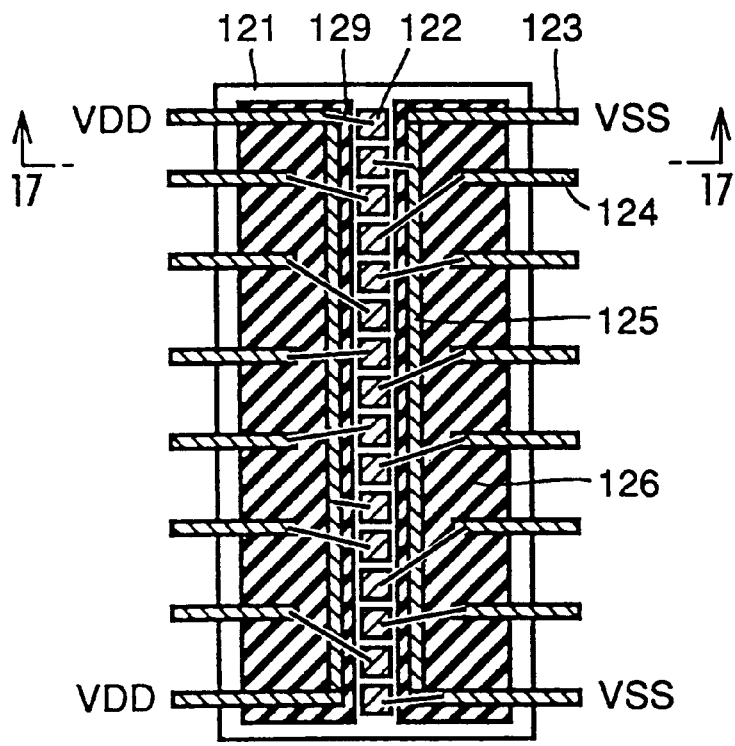
FIG. 16 is a plan view of a path bar type TSOP structure of a semiconductor device of the prior art.
Figure 17:
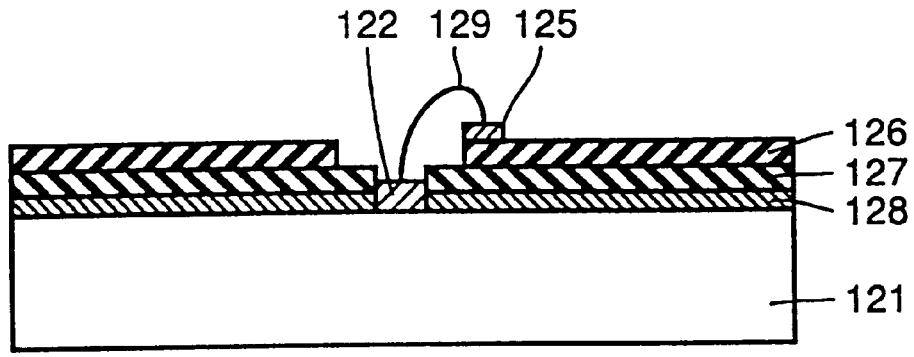
FIG. 17 is a cross section taken along the line 17—17' of FIG. 16.
Figure 18:
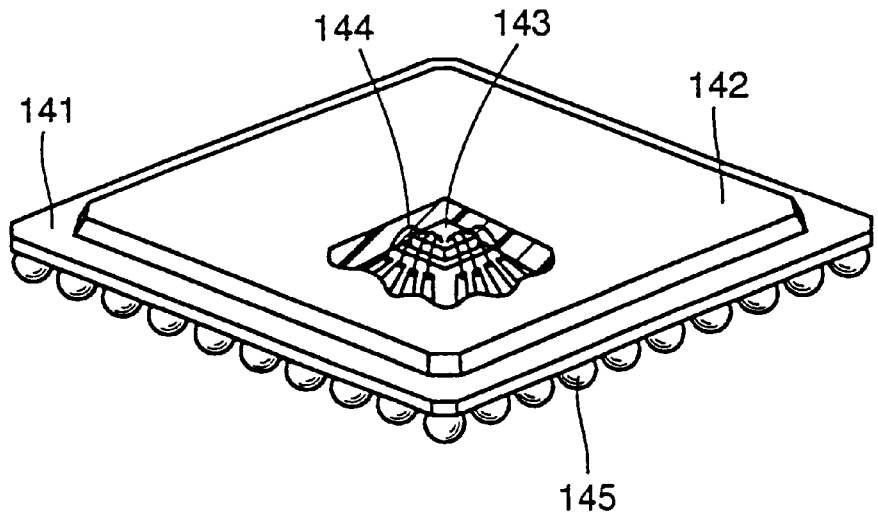
FIG. 18 is a perspective view showing overall structure of BGA of a semiconductor package in accordance with the prior art.
Figure 19:
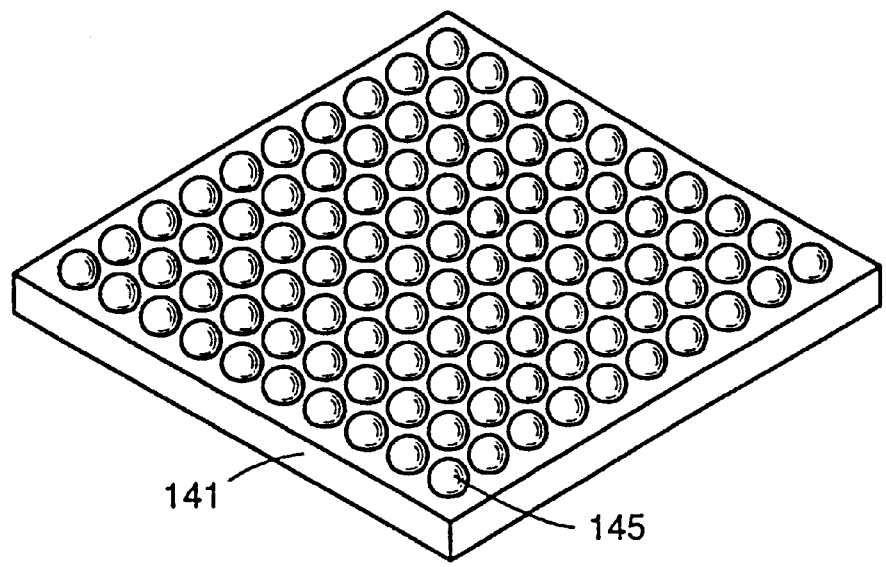
FIG. 19 shows a rear view of the BGA structure of the semiconductor device of the prior art.

The semiconductor device in accordance with the present embodiment has, as shown in FIGS. 7 and 9, a semiconductor integrated circuit 2 on a semiconductor substrate 1. Semiconductor integrated circuit 2 is covered by a passivation film 9. Along opposing sides in the longitudinal direction of semiconductor substrate 1, a plurality of bonding pads are provided, which are connected to semiconductor integrated circuit 2. Bonding pads include bonding pads 3 and 30 for the power supply potential, bonding pads 4 and 40 for ground potential and CLK bonding pads 25, provided at prescribed positions.

On the rear surface of semiconductor substrate 1, there is provided a first conductive layer 51 for supplying the power supply potential (VDD), with a first insulating film 51 such as a silicon oxide interposed. On the main surface of the first insulating film, a plurality of contact electrode 31 for the power supply potential, contact electrodes 41 for the ground potential and CLK contact electrodes 25 connected to prescribed bonding pads by means of wirings are provided, as shown in FIGS. 7 to 9.

On the first conductive layer 52, a second conductive layer 54 for supplying the ground potential (VSS) is formed with a second insulating film 53 of, for example, silicon oxide film, interposed. Further, on the second conductive layer 54, a plurality of CLK bump electrodes for connection with external terminals, bump electrodes 32 for the power supply potential, bump electrodes 33 for the ground potential are formed with a third insulating film 55 of silicon oxide film, for example, interposed.

Here, the first conductive layer 52 is connected to bump electrode 32 for the power supply potential by a first interconnection 61 provided piercing through the second insulating film 53, the second conductive layer 54 and the third insulating film 55. The second conductive layer 54 is connected to bump electrode 33 for the ground potential, through a plurality of CLK bump electrodes, as shown in FIG. 9.

Contact electrode 31 for the power supply potential is connected to the first interconnection layer 52 by a third interconnection 63 provided through first insulating film 51.

Contact electrode 41 for the ground potential is connected to the second conductive layer 54 by a fourth interconnection 64 provided through first insulating film 51, the first conductive layer 52 and the second insulating film 53.

Further, CLK contact electrode 25 is connected to CLK bump electrode 26 by a fifth interconnection 65 provided through the first insulating film 51, the first conductive layer 52, the second insulating film 53, the second conductive layer 54 and the third insulating film 55.

As described above, a plurality of contact electrodes which are connected to the bonding pads by means of wirings are arranged on the main surface of semiconductor integrated circuit 2, bump electrodes for connection with external terminals are provided on the rear surface, first and second conductive layers are formed between the contact electrodes and the bump electrodes, and the contact electrodes, bump electrodes and the first and second conductive layers are connected appropriately using the first, second, third, fourth and fifth interconnections. Therefore, the wiring between the contact electrode and the bonding pad is of the shortest length.

Accordingly, it becomes possible to provide a prescribed potential readily to a bonding pad connected to a contact electrode, voltage drop of the power supply caused by long extension of wirings experienced in the prior art can be prevented, and the power source can be reinforced.

Further, by utilizing the structure of the present embodiment, it becomes possible to form a semiconductor device for the TSOP package sealing by using a package for BGA sealing. Therefore, a semiconductor package for a semiconductor device capable of operation at high speed can be provided.

In the first and second embodiments, the present invention has been described as applied to the TSOP structure. However, similar effect can be obtained when the present invention is applied to an SOG (Small Out-line J-leaded package) structure or a TSOJ (Thin Small Out-line J-leaded package).

Though the present invention has been applied to an over mode type BGA in the third embodiment above, the present invention can be similarly applied to a flip chip BGA or to a CSP (Chip Scale Package) structure to obtain similar effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor integrated circuit;
   a conductor provided on said semiconductor integrated circuit;
   a semiconductor substrate including a first region stacked with said semiconductor integrated circuit, and a second region;
   a bonding pad disposed on the second region and connected to said conductor with a first wire; and
   a lead frame connected to said bonding pad with a second wire,
   wherein said lead frame does not extend over said first region.

2. The semiconductor device according to claim 1, wherein said bonding pad receives a power supply voltage.

3. The semiconductor device according to claim 1, wherein said bonding pad receives a ground voltage.

4. The semiconductor device according to claim 1, wherein said semiconductor integrated circuit is formed on the first region.

5. The semiconductor device according to claim 1, wherein said conductor forms an interconnection line.

6. A semiconductor device comprising:

a semiconductor integrated circuit;

a first conductor provided on said semiconductor integrated circuit;

a second conductor provided on said semiconductor integrated circuit and electrically connected to said first conductor;

a semiconductor substrate including a first region stacked with said semiconductor integrated circuit, and a second region;

a first bonding pad disposed on the second region and connected to said first conductor with a first wire; and a second bonding pad disposed on the second region and connected to said second conductor with a second wire.

7. The semiconductor device according to claim 6, further comprising a lead frame connected to said first bonding pad with a third wire.

8. The semiconductor device according to claim 6, wherein said first bonding pad is disposed on one side of the first region, and said second bonding pad is disposed on another side opposing to said one side of the first region.

9. The semiconductor device according to claim 6, wherein said semiconductor integrated circuit is formed on the first region.

10. The semiconductor device according to claim 6, wherein said first and second conductors form interconnection lines.

11. The semiconductor device according to claim 1, wherein said semiconductor integrated circuit comprises a memory.

12. The semiconductor device according to claim 6, wherein said semiconductor integrated circuit comprises a memory.

13. The semiconductor device according to claim 6, wherein said first conductor and said second conductor are disposed in substantially a same plane.

14. The semiconductor device according to claim 1, wherein the direction of extension of the first wire from the bonding pad is different from the direction of extension of the second wire from the bonding pad.

* * * * *